(12) United States Patent
Morales et al.

(10) Patent No.: US 6,245,849 B1
(45) Date of Patent: Jun. 12, 2001

(54) FABRICATION OF CERAMIC MICROSTRUCTURES FROM POLYMER COMPOSITIONS CONTAINING CERAMIC NANOPARTICLES

(75) Inventors: Alfredo Martin Morales, Pleasanton, CA (US); Z. John Zhang, Alpharetta, GA (US); Douglas Chinn, Livermore, CA (US)

(73) Assignee: Sandia Corporation, Livermore, CA (US)

( * ) Notice: Subject to any disclaimer, the term of this patent is extended or adjusted under 35 U.S.C. 154(b) by 0 days.

(21) Appl. No.: 09/325,003

(22) Filed: Jun. 2, 1999

(51) Int. Cl.[7] ....................................................... C08K 3/00
(52) U.S. Cl. ......................... 524/442; 524/443; 524/444; 524/445; 524/447; 524/448; 524/450
(58) Field of Search .................................. 524/442, 443, 524/444, 445, 447, 448, 450

(56) References Cited

U.S. PATENT DOCUMENTS

| | | |
|---|---|---|
| 5,190,637 | 3/1993 | Guckel . |
| 5,576,147 | 11/1996 | Guckel . |

OTHER PUBLICATIONS

Andrievsky (1998), "State–of–the Art and Perspectives in the Field of Particulate Nanostructured Materials," *J. Mater. Sci. Technol.*, 14:97–103.

Becker et al. (1986), "Fabrication of Microstructures with High Aspect Ratios and Great Structural Heights by Synchrotron Radiation Lithography, Galvanoforming, and Plastic Moulding, (LIGA Process)," *Microelectronic Engineering*, 4(1):35–56.

Ehrfeld et al. (1998), "LIGA Process: Sensor Construction Techniques via x–Ray Lithography," *Tech. Digest from IEEE Solid–State Sensor and Actuator Workshop*, Hilton Head, SC.

Guckel et al. (1991), "Fabrication and Testing of the Planar Magnetic Micromotor," *J. Micromech. Microeng.*, 1:135–138.

*Primary Examiner*—Edward J. Cain
(74) *Attorney, Agent, or Firm*—Dianne E. Reed; Reed & Associates

(57) ABSTRACT

A method is provided for fabricating ceramic microstructures, i.e., microcomponents of micron or submicron dimensions. A polymer composition is prepared containing a polymer, typically a thermally or chemically curable polymer, and nanometer size (1 to 1000 nm in diameter) ceramic particles. A mold, such as a lithographically patterned mold, preferably a LIGA mold, is filled with the polymer composition and the polymer is then cured or otherwise hardened. The elevated segments of the mold are then removed. The surface-attached ceramic microstructures so provided may then be removed from the substrate and, if desired, pyrolyzed and sintered.

53 Claims, 13 Drawing Sheets

FABRICATION OF CERAMIC MICROSTRUCTURES FROM POLYMER COMPOSITIONS CONTAINING CERAMIC NANOPARTICLES

TECHNICAL FIELD

This invention relates generally to the preparation of ceramic microstructures. More specifically, the invention relates to the fabrication of ceramic components of micron or submicron dimensions using polymer compositions, preferably curable polymer compositions, containing ceramic nanoparticles and lithographically or otherwise patterned molds. The invention pertains to miniaturization and "nanotechnology," and has utility in many fields, including microelectromechanical system fabrication, semiconductor processing, information storage, medical diagnostics, optics, materials science, and structural engineering.

BACKGROUND

"Nanotechnology" refers to nanometer-scale manufacturing processes, materials and devices, as associated with, for example, nanometer-scale lithography and nanometer-scale information storage. See, for example, *Nanotechnology*, ed. G. Timp (New York: Springer-Verlag, 1999), and *Nanoparticles and Nanostructured Films*, ed. J. H. Fendler (Weinheim, Germany: Wiley-VCH, 1998). Nanometer-scale components find utility in a wide variety of fields, particularly in the fabrication of microelectromechanical systems (commonly referred to as "MEMS"). Such systems include, for example, micro-sensors, micro-actuators, micro-instruments, micro-optics, and the like. Many MEMS fabrication processes exist, and tend to fall into the two categories of surface micro-machining and bulk-micromachining. The latter technique involves formation of microstructuring by etching directly into a bulk material, typically using wet chemical etching or reactive ion etching ("RIE"). Surface micromachining involves fabrication of microelectromechanical systems from films deposited on the surface of a substrate, e.g., from thin layers of polysilicon deposited on a sacrificial layer of silicon dioxide present on a single crystal silicon substrate (this technique is commonly referred to as the "thin film polysilicon process").

An exemplary surface micro-machining process is known as "LIGA." See, for example, Becker et al. (1986), "Fabrication of Microstructures with High Aspect Ratios and Great Structural Heights by Synchrotron Radiation Lithography Galvanoforming, and Plastic Moulding (LIGA Process)," *Microelectronic Engineering* 4(1):35–36; Ehrfeld et al. (1988), "1988 LIGA Process: Sensor Construction Techniques via x-Ray Lithography," *Tech. Digest from IEEE Solid-State Sensor and Actuator Workshop*, Hilton Head, S.C.; Guckel et al. (1991) *J. Micromech. Microeng.* 1: 135–138. A related process is termed "SLIGA," and refers to a LIGA process involving sacrificial layers. LIGA is the German acronym for X-ray lithography ("lithographie"), electrodeposition ("galvanoformung") and molding ("abformtechnik"), and was developed in the mid-1970's. LIGA involves deposition of a relatively thick layer of an X-ray resist on a substrate, e.g., metallized silicon, followed by exposure to high-energy X-ray radiation through an X-ray mask, and removal of the irradiated resist portions using a chemical developer. The mold so provided can be used to prepare structures having horizontal dimensions— i.e., diameters—on the order of microns. The technique is now used to prepare metallic microcomponents by electroplating in the recesses (i.e., the developed regions) of the LIGA mold. See, for example, U.S. Pat. Nos. 5,190,637 to Guckel et al. and 5,576,147 to Guckel et al.

While metallic microcomponents are useful in a host of applications, nonmetallic components are obviously desirable as well. Ceramic microcomponents, i.e., microcomponents containing ceramic material (as in a ceramic/polymer composite) or that are entirely ceramic in nature, would clearly be useful in a number of applications, insofar as such materials can provide a host of advantageous properties, including increased toughness, thermal stability, chemical and biological compatibility, magnetism, piezoelectricity, ferroelectricity, photochromism, lasing, etc.

To date, however, no suitable method has been developed for the fabrication of ceramic microstructures. In general, ceramics are extremely difficult to machine, and even the most refined precision manufacturing techniques have failed to provide ceramic components of microscopic dimensions.

SUMMARY OF THE INVENTION

Accordingly, the invention is directed to the aforementioned need in the art and provides a method for making ceramic microstructures, i.e., ceramic components of micron or submicron dimensions.

It is another object of the invention to provide such a method which involves compressing, into a patterned mold, a curable polymer composition comprising a curable binder polymer and ceramic nanoparticles, and curing the polymer.

It is still another object of the invention to provide such a method wherein the patterned mold is a lithographically patterned mold such as a LIGA mold.

It is yet another object of the invention to provide such a method wherein the binder polymer is thermally, chemically or photolytically cured.

It is a further object of the invention to provide a method for making ceramic microstructures which involves compressing, into a patterned mold, a paste comprising an admixture of a binder polymer, ceramic nanoparticles and a solvent for the polymer, and wherein the composition is then hardened by removal of the solvent, e.g., by heating and/or vacuum.

It is still a further object of the invention to provide novel ceramic microcomponents fabricated using the methodology disclosed and claimed herein.

It is an additional object of the invention to provide ceramic microcomponents having an aspect ratio of at least about 20:1.

It is still an additional object of the invention to provide such microcomponents which, as fabricated, are affixed to the surface of a functional substrate such as a silicon wafer.

Additional objects, advantages and novel features of the invention will be set forth in part in the description which follows, and in part will become apparent to those skilled in the art upon examination of the following, or may be learned by practice of the invention.

In one aspect of the invention, then, a process for preparing ceramic microstructures is provided which involves compression molding a curable polymer composition in a suitable mold, typically a lithographically patterned mold such as a LIGA mold, wherein the curable polymer composition is comprised of a curable binder polymer and nanoparticles of a ceramic material. The polymer composition is cured, thermally, chemically, photolytically, or otherwise, to provide ceramic microstructures within the voids of the patterned relief surface on the mold that is employed. Following planarization, the elevated segments of the mold are removed, leaving the ceramic microstructures on the substrate surface; at that point, the microstructures can, if desired, be removed from the surface, pyrolyzed to remove any organic material and convert any inorganic material to ceramic material, and sintered. Ceramic components of micron or submicron dimensions can be prepared in this manner. With a LIGA mold, such components may be prepared having high aspect ratios, i.e., greater than about 20:1, preferably greater than about 40:1. In addition, depending on the ceramic material selected, ceramic microstructures can be fabricated with desirable optical, structural, magnetic, piezoelectric or other properties.

In another aspect of the invention, a process is provided for preparing ceramic microstructures which involves initially compression molding a polymer composition in a suitable mold, as above, but wherein the polymeric component of the composition is not subsequently cured. Rather, after compression molding a paste comprising an admixture of a binder polymer, ceramic nanoparticles and a solvent for the polymer, the composition is then hardened by removal of the solvent, e.g., by heating and/or vacuum. Although the composition is hardened by solvent removal and thus forms a ceramic madrix, the binder polymer is not crosslinked, i.e., cured. In this embodiment, then, the binder polymer may or may not be a curable polymer as such.

In a further aspect of the invention, a process is provided for preparing ceramic microstructures that are permanently locked in place on a substrate surface, i.e., are mechanically locked thereon, eliminating the need for adhesives or other fastening means. The method involves curing and/or hardening a polymer composition comprising ceramic nanoparticles, as described above, using a substrate having one or more recesses in which the interior diameter or width of the recess is smaller on the substrate surface and larger within the substrate interior (as in a dovetail recess), such that a ceramic component fabricated therein cannot be mechanically extracted from the substrate surface. In some cases, it may be advantageous for the locked-in microstructure to be free to rotate about a central axis. This may be readily accomplished by deposition of a decomposable or otherwise removable release layer on the substrate surface, including on the interior of the surface recess or recesses, prior to fabrication of the ceramic microstructure. The release layer is removed following microstructure fabrication, leaving a gap between the substrate surface, including the interior surface of the recess or recesses, and the exterior of the newly fabricated microstructure.

In an additional aspect of the invention, certain ceramic microstructures are prepared as novel compositions of matter. The novel ceramic microstructures comprise a compressed solid of (1) a matrix of a cured or hardened polymer, and (2) ceramic nanoparticles dispersed throughout the matrix, wherein the aspect ratio of the microstructure is greater than about 20:1, preferably greater than about 40:1.

DETAILED DESCRIPTION OF THE INVENTION

Figure 1:
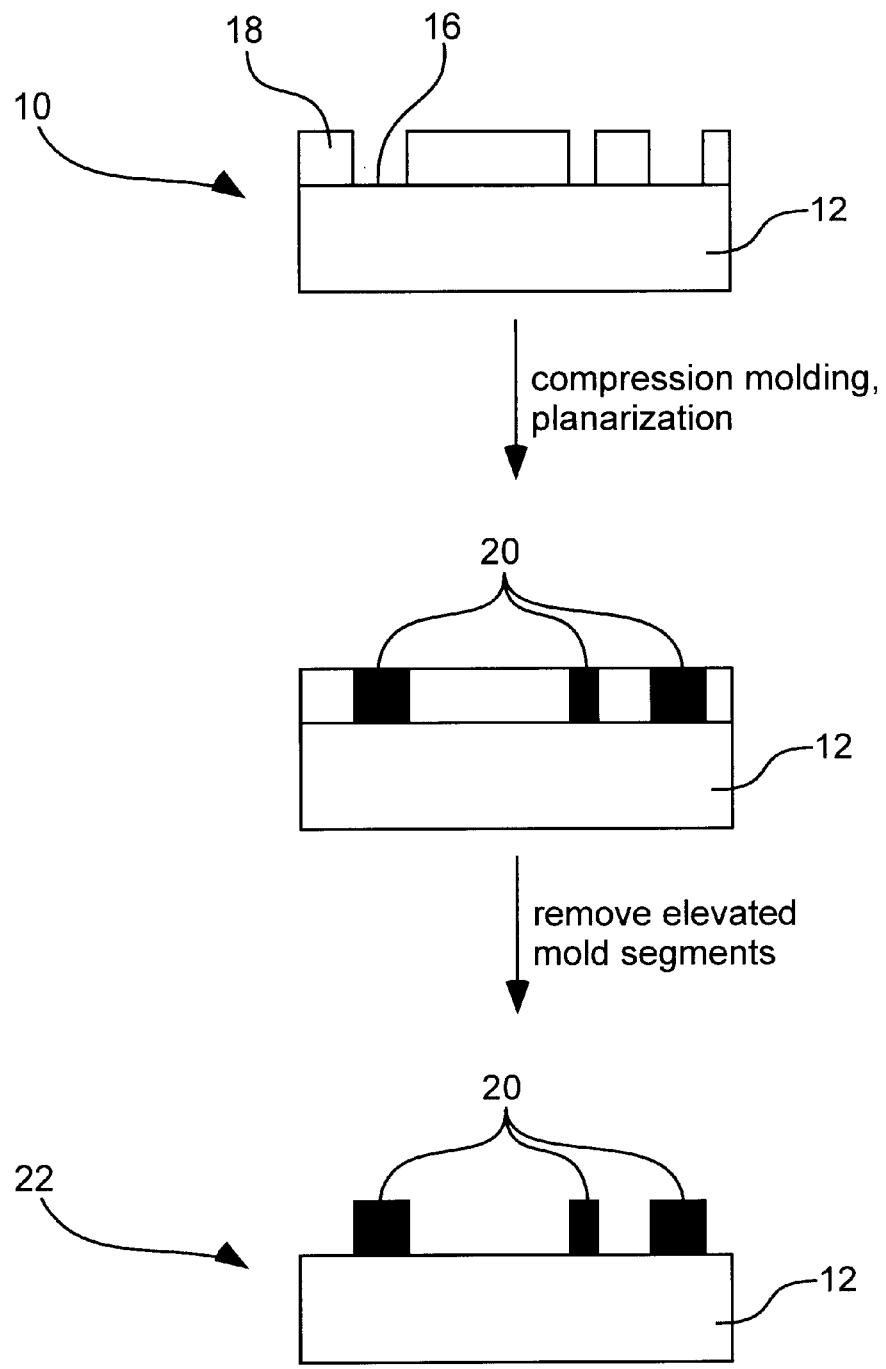
FIG. 1 schematically illustrates fabrication of ceramic microstructures according to the invention.

Definitions:

It is to be understood that unless otherwise indicated, this invention is not limited to specific materials (e.g., specific polymers or ceramic materials), processing conditions, manufacturing equipment, or the like, as such may vary. It is also to be understood that the terminology used herein is for the purpose of describing particular embodiments only and is not intended to be limiting.

It must be noted that, as used in the specification and the appended claims, the singular forms "a," "an" and "the" include plural referents unless the context clearly dictates otherwise. Thus, for example, reference to "a curable polymer" includes mixtures of curable polymers, reference to "a ceramic material" includes mixtures of ceramic materials, and the like.

The term "ceramic material" is used to refer to material that contains ceramic material or is wholly ceramic in nature, wherein the term "ceramic" is used in its conventional sense to indicate a nonmetallic, inorganic material such as a metal oxide. Thus, the term "ceramic materials" as used herein encompasses composites, containing both ceramic and nonceramic material, as well as materials that are entirely ceramic and do not contain any nonceramic material.

The term "polymer" is used herein in its conventional sense to refer to a compound having two or more monomer units, and is intended to encompass homopolymers as well as copolymers, including, for example, graft copolymers. Those polymers herein that are referred to as "curable" are capable of becoming crosslinked, either thermally, chemically or photolytically, so that a cured polymeric matrix may be provided.

The terms "microstructure" and "microcomponent" are used interchangeably herein to refer to a three-dimensional solid structure whose height, width (or diameter) or length is less than about 100 microns, i.e., at least one dimension of the three-dimensional structure is less than about 100 microns.

The term "aspect ratio" is used herein in its conventional sense to refer to the ratio of an object's height to its width (or diameter). High aspect ratio structures are thus prepared using molds (such as LIGA molds) having very voids, or recesses, that are extremely narrow relative to their height.

"Optional" or "optionally" means that the subsequently described circumstance may or may not occur, so that the description includes instances where the circumstance occurs and instances where it does not. For example, the phrase "optionally sintered" means that a material may or may not be sintered, and the description thus includes sintered materials as well as nonsintered materials. Similarly, a microstructure fabrication method or system that includes an "optionally present" release layer encompasses methods and systems that make use of a release layer as well as methods and systems that do not make use of a release layer.

Preparation of Ceramic Microstructures:

The invention thus features a process for preparing ceramic microstructures which involves, initially, providing a substrate having a patterned relief structure on its surface to serve as a mold, wherein the microstructures are to be formed within the recesses present within the pattern, i.e., around and between corresponding elevated segments on the substrate surface. The mold is filled with a curable polymer composition containing ceramic nanoparticles and a curable binder polymer, and external pressure is applied to press the composition into the mold. The polymer composition is then cured to provide a hardened ceramic material, i.e., the "ceramic microstructures," in the recesses of the mold. Preferably, the surface is then planarized. At this point, the elevated segments of the mold can be removed, leaving the ceramic microstructures on the substrate surface. If desired, the ceramic microstructures can then be removed from the surface as well. In an alternative embodiment, the binder polymer is not necessarily cured or curable. Rather, a paste is formed comprising ceramic nanoparticles, binder polymer and solvent, and following compression of the paste into the recesses of the mold, the solvent is removed under vacuum and/or by heating, to harden but not cure the polymer.

The mold is typically although not necessarily a lithographically patterned mold, prepared, for example, using optical, X-ray, electron-beam, or ion-beam methods, but preferably fabricated using LIGA technology. As will be appreciated by those skilled in the art, preparation of a LIGA mold involves deposition of a layer of an X-ray resist on a substrate having a conductive surface, which may or may not be pretreated with an adhesion-promoting layer such as a metal oxide (e.g., oxides of titanium and/or copper) or with a silanization reagent such as methacryloxypropyl trimethoxysilane, to facilitate adhesion of the resist to the substrate surface. Metallized silicon is a preferred substrate.

Suitable X-ray resists may comprise, for example, poly (methyl methacrylate) ("PMMA") or copolymers thereof such as poly(methyl methacrylate-co-t-butylmethacrylate), a poly(lactide) such as poly(lactide-co-glycolide), polymethacrylamide, polyoxymethylene, polyalkenesulfone, or poly(glycidylmethacrylate-co-ethyl acrylate). The resist is deposited using any of a number of conventional techniques, e.g., sequential spin coating or the like. The deposited resist is irradiated using X-ray radiation, such as from a synchrotron, and an X-ray mask to provide the desired mold pattern. Following exposure, the resist is developed using a suitable solvent to remove the irradiated areas. The resulting mold, then, is comprised of a substrate having a patterned relief structure on the substrate surface comprised of elevated segments (i.e., the undeveloped resist) with corresponding voids therebetween. In a preferred embodiment, the remaining surface is treated so that removal of ceramic microstructures fabricated thereon is facilitated; suitable surface treatments include, but are not limited to, polishing, application of a low adhesion coating comprised of a material-releasing agent such as poly (tetrafluoroethylene), silicones, waxes or the like, and deposition of a decomposable or otherwise removable release layer (as may also be termed a "sacrificial" layer) such as a poly(methyl methacrylate).

The molds that can be used in conjunction with the present invention may also be fabricated using other techniques, as alluded to above. LIGA molds are preferred, however, insofar as such molds can be prepared so as to have very high aspect ratios, and can thus provide high aspect ratio ceramic microstructures. The the aspect ratio of the ceramic microstructures prepared herein, using LIGA molds, can be 20:1 or even 40:1 or higher.

After the mold is fabricated or otherwise obtained, a polymer composition is prepared comprising a binder polymer and ceramic nanoparticles. Preferred binder polymers are curable, and include thermally curable polymers, chemically curable polymers, and photolytically curable polymers. If a thermally curable polymer is used, the temperature to which the polymer composition is heated, during microcomponent fabrication, is kept to the minimum necessary to bring about cure, so as to avoid deformation of the mold and shrinkage. If a chemically curable polymer is used, an appropriate curing agent is typically required. Binder polymers useful in conjunction with the invention include, but are not limited to: vinyl and acrylic polymers such as poly(vinyl alcohol), poly(vinyl amine), poly(vinyl acetate), poly(vinyl halides) including poly(vinyl chloride) and poly (vinyl fluoride), poly(vinylidene halides) including poly (vinylidene chloride) and poly(vinylidene fluoride), polystyrene, poly(o-bromostyrene), poly(m-methylstyrene), poly(p-methylstyrene), poly(o-hydroxystyrene), poly(m-hydroxystyrene), poly(p-hydroxystyrene), poly(vinyl phosphate), poly(vinyl pyrrolidone), poly(methyl vinyl ether), poly(ethyl vinyl ether), poly(methyl vinyl ketone), poly(acrylonitrile), vinyl-pyrrolidone-vinyl acetate copolymers, vinyl acetate-acrylic acid copolymers, vinyl alcohol-vinyl acetate copolymers, vinyl pyrrolidone-styrene copolymers, poly(acrylic acid), poly(acrylamide), poly (methacrylic acid), poly(methyl acrylate), poly(ethyl acrylate), poly(butyl acrylate), poly(acrylonitrile-acrylic acid), poly(styrene-acrylic acid), poly(butadiene-acrylonitrile acrylic acid), poly(butylacrylate-acrylic acid), poly(methyl methacrylate), poly(ethyl methacrylate), poly (ethyl acrylate-acrylic acid), poly(methacrylate-acrylic acid), poly(methyl methacrylate-acrylic acid) and poly (methyl methacrylate-styrene-acrylic acid); silicone resins such as polyhydridosiloxane, poly(methylsiloxane), poly (dimethylsiloxane), poly(ethylsiloxane), poly (diethylsiloxane), poly(phenylsiloxane), poly (methylphenylsiloxane), poly(ethylphenylsiloxane) and poly(diphenylsiloxane); other inorganic, preferably silicon-containing, polymers such as polysilazanes and polysiloxazanes; epoxy resins, i.e., polymers formed by step polymerization of an epoxide such as epichlorohydrin and a dihydroxy compound, wherein suitable dihydroxy compounds include bisphenol A (2,2-bis(4-hydroxyphenyl) propane), hydroquinone, resorcinol, novolacs, and the like; polyesters such as poly(ethylene terephthalate), poly (butylene terephthalate), poly(lactic acid), and copolymers of substituted and/or unsubstituted styrene monomers and ester moieties; polyethers such as polyacetal, poly(ethylene glycol), poly(oxyethylene), poly(oxypropylene) and poly (tetrahydrofuran); and copolymers and blends of any of the foregoing.

The ceramic nanoparticles may be obtained commercially (e.g., from TPL [Technologies to Products], Albuquerque, N.

Mex.; Materials Modification, Incl, Fairfax, Va.; and Nanophase Technologies Corporation, Burr Bridge, Ill.) or fabricated using techniques known to those skilled in the art and/or described in the pertinent texts and literature (see, e.g., R. A. Andrievsky (1998), "State-of-the-Art and Perspectives in the Field of Particulate Nanostructured Materials," *J. Mater. Sci. Technol.* 14:97–103). Generally, the nanoparticles will be approximately 1 to 1000 nm in diameter, preferably 1 to 500 mn in diameter, and most preferably 1 to 100 nm in diameter. Typical ceramic materials used in conjunction with the invention include: metal oxides such as $Al_2O_3$, $ZrO_2$, $TiO_2$, ZnO, $SiO_2$, $BaTiO_3$, $BaZrO_3$, $SrTiO_3$, $WO_2$, $WO_3$, $Fe_2O_3$, $Fe_3O_4$, $Ca_5(PO_4)OH$, $MnFe_2O_4$, $PbZr_{0.5}Ti_{0.5}O_3$, $BaFe_{12}O_{19}$, $CrO_2$, $Cr_2O_3$, $MoO_2$ and $MoO_3$; silicon-containing ceramics such as SiC, $Si_3N_4$ and $Si_2ON_2$; aluminum nitride; tungsten carbide; samarium cobalt ($SmCo_5$); neodymium iron boride (NdFeB); TiC; TiN; $MoSe_2$; $MoSe_3$; $MoS_2$; and $MoS_3$. Any ceramic material can be used, and the process of the invention is not in any way limited with regard to a specific ceramic material or materials. However, as certain ceramic materials can provide a specific function in a particular context, the context may dictate choice of material. That is, when the final ceramic microstructure is to be magnetic, a magnetic ceramic material such as $MnFe_2O_4$ is used, when a piezoelectric ceramic microstructure is desired, a piezoelectric ceramic material such as $PbZr_{0.5}Ti_{0.5}O_3$ or $BaFe_{12}O_{19}$ is used, etc. The following table sets forth preferred ceramic materials according to their properties and the intended function of the ceramic microstructure:

TABLE 1

| Intended Function | Class | Ceramic Material |
| --- | --- | --- |
| Magnetic | Soft | $MnFe_2O_4$ |
|  | Hard | $SmCo_5$, NdFeB |
| Electrical | Insulation | $Al_2O_3$ |
|  | Piezoelectric | $PbZr_{0.5}Ti_{0.5}O_3$, $BaFe_{12}O_{19}$ |
|  | Ferroelectric | $BaTiO_3$, $SrTiO_3$ |
| Optical | Transparent | $Al_2O_3$ |
|  | Photochromism | $MoO_3$, $WO_3$ |
| Mechanical | Refractory | $Al_2O_3$, SiC, $Si_3N_4$ |
|  | Wear-Resistant | $Al_2O_3$, SiC, $Si_3N_4$, $ZrO_2$ |
|  | Cutting | $Al_2O_3$, $ZrO_2$, $Si_3N_4$ |
|  | Lubrication | $MoS_2$ |
| Thermal | Insulation | $Al_2O_3$, $ZrO_2$, $SiO_2$ |
|  | Radiator | $ZrO_2$, $TiO_2$ |
| Chemical | Gas Sensor | ZnO, $ZrO_2$, $Fe_2O_3$ |
|  | Filters | $SiO_2$, $Al_2O_3$ |
| Biological | Biocompatible | $Ca_5(PO_4)_3OH$ |

The ceramic nanoparticles generally represent on the order of 5 wt. % to 95 wt. % of the polymer composition, preferably about 15 wt. % to 90 wt. % of the composition, while the polymeric component per se typically represents about 5 wt. % to 95 wt. %, preferably about 5 wt. % to 30 wt. % of the composition, and the remainder of the polymer composition is comprised of solvent. The solvent is such that the binder polymer dissolves therein; a preferred solvent is water, but lower alkanols ($C_1$–$C_6$ alkanols, preferably $C_1$–$C_4$ alkanols) such as ethanol, isopropanol and the like may be also used. The polymer composition is typically prepared by simple admixture of the components, with the solvent added last in an amount sufficient to provide the composition in the form of a paste of a desired viscosity, suitable for application to the mold described above. The polymer composition may contain other components as well, such as additional binder polymers, catalysts, metal powders, flexibilizers, surfactants, nanoparticle surface modifying primers, etc.

The polymer composition so prepared is then applied to the mold, and pressure is applied to ensure that the mold is completely filled. Typically, the applied pressure is at least about 1000 $lb/in^2$, preferably at least about 5000 $lb/in^2$. For compositions containing thermally curable polymers, heat is applied along with pressure, such as by using a combined hydraulic press and heater. The heating temperature and time will depend on the polymer used, but generally temperatures higher than about 50° C., more typically higher than about 70° C., are employed, with heating times of 30 minutes or more. For photolytically curable polymers, the applied polymer composition is irradiated with light of a suitable wavelength (e.g., ultraviolet light) rather than heated. In some cases, i.e., with some curable polymers, irradiation with an electron beam is particularly effective in bringing about curing. For chemically curable polymers, a curing agent is present in the polymer composition that brings about curing during the compression step. With binder polymers that are not cured and are not necessarily curable, heating temperature and time are selected simply to effect solvent removal; solvent may also be removed by vacuum, instead of or in addition to heating. Solvent removal results in a hardened ceramic composition.

Following compression, the mold surface is planarized using conventional equipment and techniques to remove excess polymer composition. The elevated segments of the mold are then removed, e.g., by stripping with a suitable solvent or ashing in an oxygen plasma. If one or more sacrificial mold release layers is present on the substrate surface (e.g., formed from poly(methyl methacrylate) or the like), the elevated mold segments and newly formed ceramic microcomponents can be freed from the substrate surface by removal of the sacrificial layer or layers; see, e.g., U.S. Pat. No 5,576,147 to Guckel et al., cited earlier herein. The surface-attached ceramic microcomponents can also be removed mechanically. Alternatively, the ceramic microcomponents may, if desired, be retained on the substrate on which they are fabricated. The process is thus advantageous in those contexts where microcomponents would otherwise need to be affixed to a substrate surface.

The microstructures prepared as just described will comprise a cured or hardened polymer, and, dispersed therein, ceramic material deriving from the ceramic nanoparticles. Such a structure is in effect a "composite," i.e., an admixture of a ceramic material and a nonceramic material. If desired, the composite microstructures can be subjected to a pyrolysis step to remove organic material and convert all inorganic material present to ceramic material. Pyrolysis may be conducted on the substrate, or, alternatively, the free, i.e., removed, microstructures may be pyrolyzed. Pyrolysis temperatures are generally in the range of about 300° C. to 700° C., preferably in the range of about 400° C. to 600° C. Generally, although not necessarily, pyrolysis is conducted in an oxygen-containing atmosphere. The microstructures may also be sintered, i.e., heated to a temperature of at least about 1200° C., preferably at least about 1500° C., with the preferred temperature typically approximating 75% of the melting temperature of the ceramic body. As will be appreciated by those skilled in the art, sintering is carried out to bring about densification and grain growth of the ceramic material.

The method of the invention is illustrated schematically in FIG. 1, where the patterned mold is shown generally at 10, comprised of substrate 12 and voids 16 between corresponding elevated segments 18. The polymer composition, having been introduced into the mold and the mold then planarized, is shown at 20. Following curing and/or hardening of the polymer composition and subsequent removal of the elevated segments, a substrate having ceramic microstructures 20 affixed thereto is provided, indicated at 22.

Figure 2:
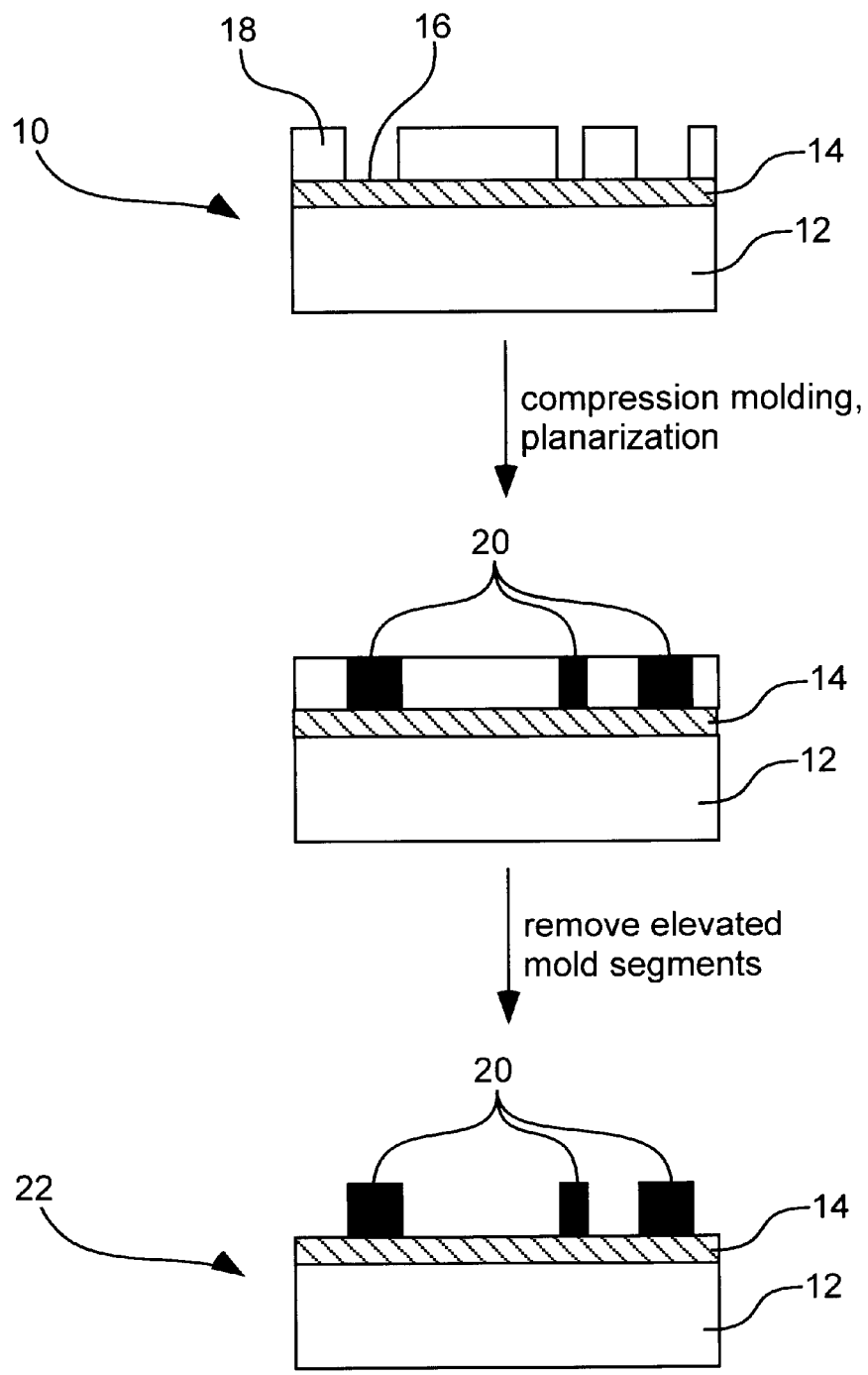
FIG. 2 schematically illustrates fabrication of ceramic microstructures as in FIG. 1, but includes the use of a release layer on the substrate surface.

A preferred variation on the aforementioned method is illustrated in FIG. 2, wherein substrate 12 is provided with an overlying decomposable or otherwise removable release layer 14 as may be formed, for example, from poly(methyl methacrylate). As in the method of FIG. 1, the polymer composition comprised of a binder polymer, ceramic nanoparticles and solvent is compression molded into the surface recesses or "voids" indicated at 16, between corresponding elevated segments 18. Following curing and/or hardening of the polymer composition and subsequent removal of the elevated segments, surface-bound ceramic microstructures are provided in which the microstructures 20 are affixed to release layer 14.

The microstructures may be removed from the substrate surface, e.g., mechanically, chemically, and/or by removal of the release layer 14. A poly(methyl methacrylate) release layer can be removed, for example, by immersion in a PMMA solvent such as acetone.

Figure 3:
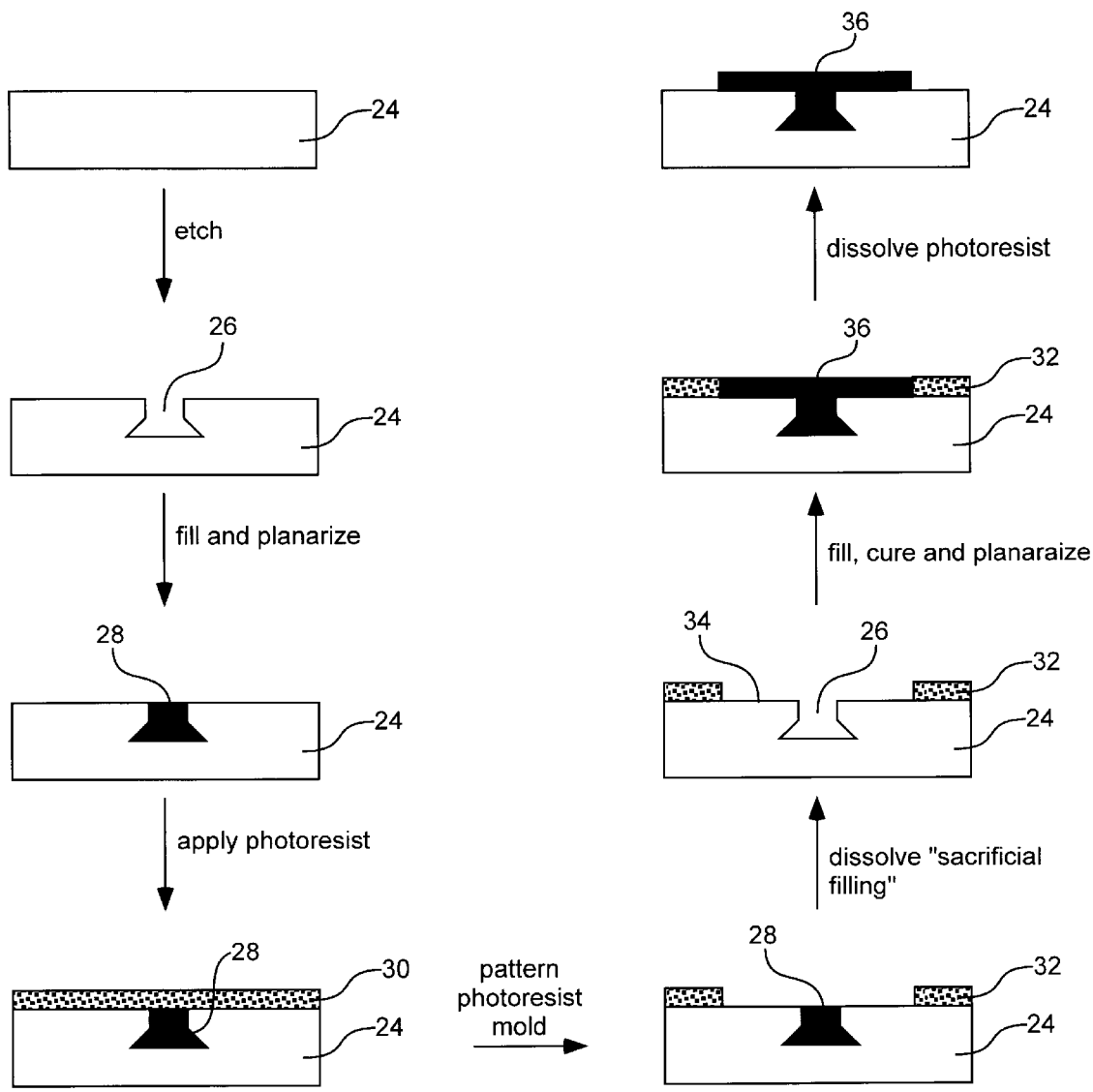
FIG. 3 schematically illustrates preparation of a ceramic microstructure within a dovetail recess of a substrate surface such that the microstructure is mechanically locked in place thereon.

In an alternative embodiment, ceramic microcomponents are prepared that are permanently affixed to a substrate. This process is illustrated in FIG. 3. Initially, substrate 24 is etched, using either chemical or plasma etching, to provide a dovetail-shaped recess 26. A sacrificial filling 28 is introduced into recess 26, followed by application of a photoresist layer 30. The photoresist is patterned using conventional means, i.e., is irradiated through a mask and subsequently developed, to provide elevated resist segments 32. The sacrificial filling 28 in dovetail recess 26 is then removed, leaving a mold consisting of the elevated resist segments 32, voids 34 therebetween, and dovetail recess 26. A polymer composition as prepared herein, containing ceramic nanoparticles and a binder polymer, is introduced into the mold, pressure is applied and the composition is cured and/or hardened as described previously, resulting in ceramic microstructure 36. Removal of elevated resist segments 32 results in a substrate having ceramic microstructure 36 "locked in" to the substrate surface, as shown in the figure. A given substrate may have more than one recess, such that two or more ceramic microstructures can be prepared simultaneously.

Figure 4:
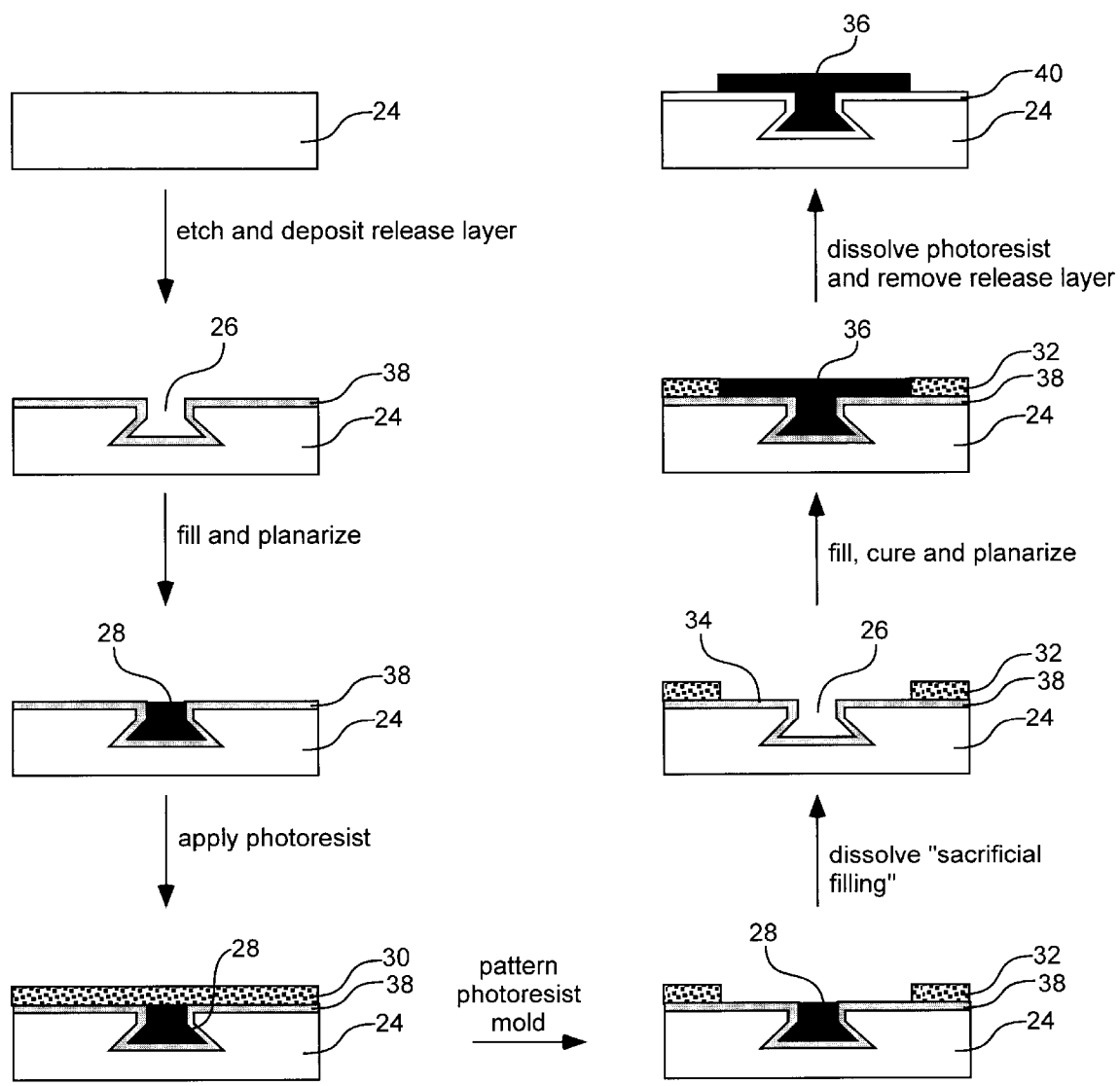
FIG. 4 schematically illustrates preparation of a "locked in" ceramic microstructure as shown in FIG. 3, but wherein a decomposable or otherwise release layer is included and removed following microstructure fabrication, to enable rotation of the final microstructure about a central axis while nevertheless being locked into the substrate surface.

A variation on the aforementioned method is illustrated schematically in FIG. 4. In this alternative method, the final microstructure is also locked in to the substrate surface as a result of having been fabricated in a dovetail-shaped recess; however, a gap between the finished microstructure and both the substrate surface and the interior of the recess allows the microstructure to rotate about a central axis. This is accomplished by deposition of a release layer 38 prior to filling the recess with the polymer composition. As may be seen in the figure, the release layer is present throughout microstructure fabrication, and is removed along with or subsequent to dissolution of the photoresist. Removal of the release layer 38 results in a gap 40, resulting in a locked-in microstructure that is free to rotate about a central axis, while maintained in place on the substrate surface.

The processes of the invention thus provide ceramic microstructures, i.e., ceramic components having micron or submicron dimensions. The present method is readily scaled up to provide a viable manufacturing process for fabricating ceramic microstructures. The method makes use of available equipment and commonly used reagents and materials, and involves relatively mild processing conditions (e.g., relatively low temperatures are need to cure most "thermally curable" polymers). The invention is useful in a host of applications and technical fields, including MEMS fabrication and semiconductor processing, information storage, medical diagnostics, optics, and the manufacture of structural materials.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experimental:

The following examples are put forth so as to provide those of ordinary skill in the art with a complete disclosure and description of how to carry out the method of the invention. Efforts have been made to ensure accuracy with respect to numbers (e.g., quantities, temperature, etc.) but some errors and deviations should be accounted for. Unless indicated otherwise, parts are parts by weight, temperature is in °C. and pressure is at or near atmospheric. Additionally, all starting materials were obtained commercially or synthesized using known procedures.

EXAMPLE 1

This example describes preparation of $Al_2O_3$ microstructures using poly(vinyl alcohol) and poly(acrylic acid) as binder polymers.

Figure 5:
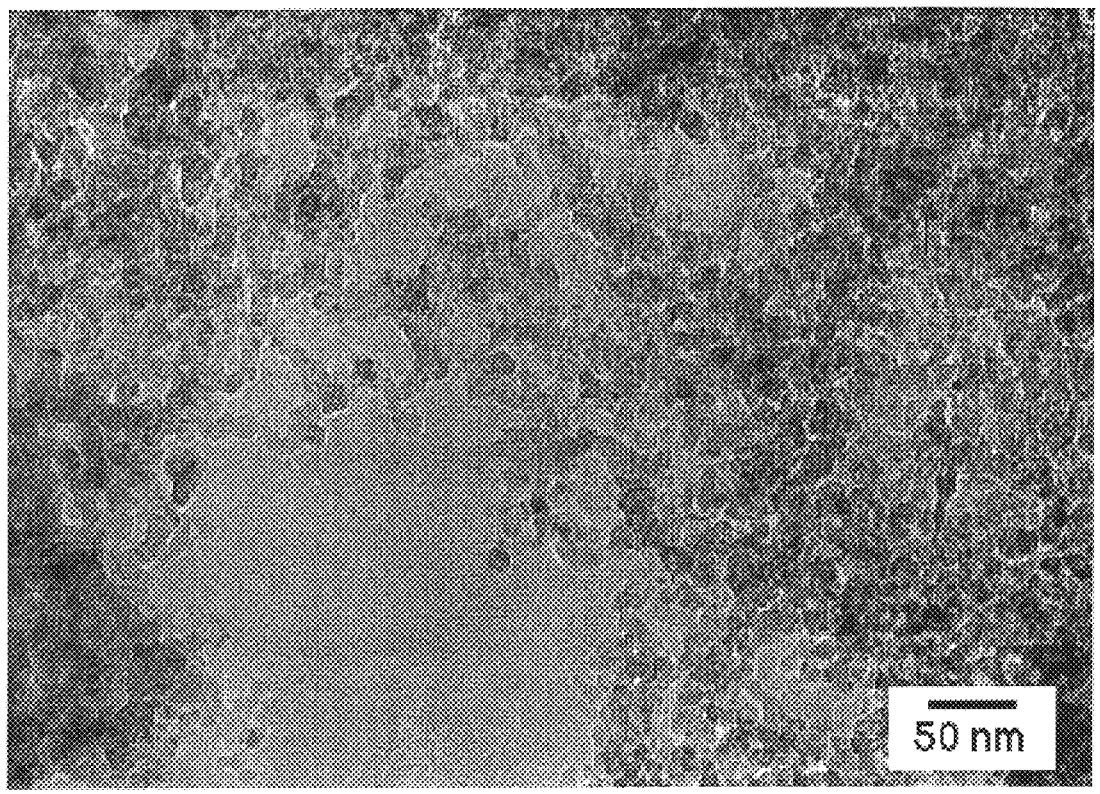
FIG. 5 is an SEM photograph of the starting material used in Example 1, and shows the individual nanometer size grains of alumina.
Figure 6:
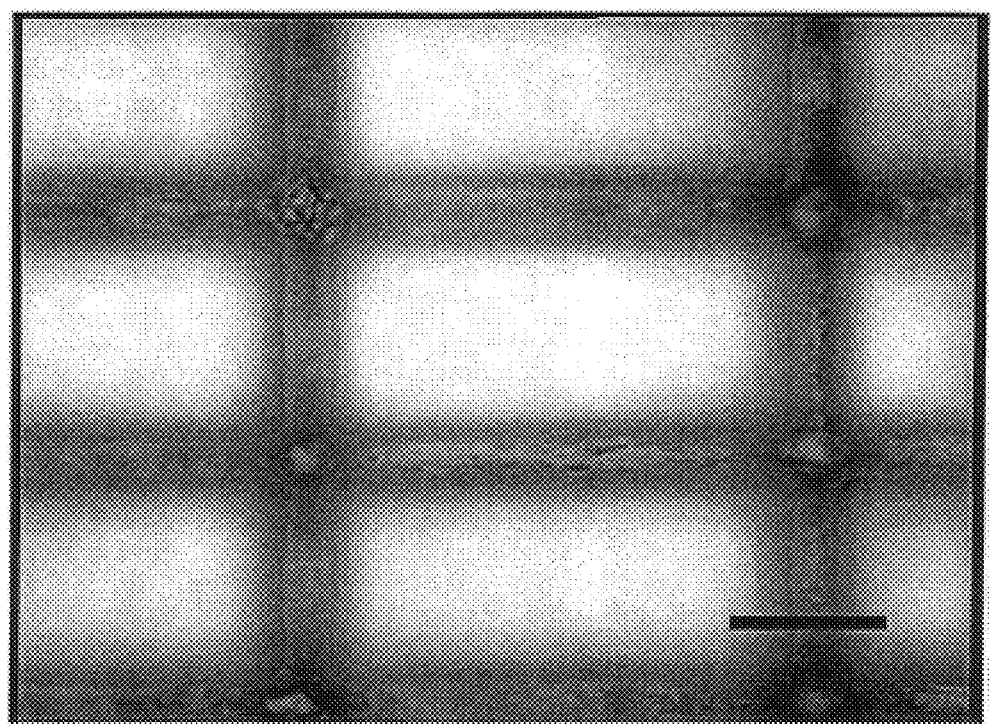
FIG. 6 is an optical micrograph of the grid pattern of the ceramic microstructures prepared in Example 1, before removal from the substrate surface.
Figure 7:
FIG. 7 is a TEM photograph of the ceramic product of Example 1, after having been sheared off of the substrate surface.

An aqueous slurry of $Al_2O_3$ nanoparticles was prepared with 1.36 g $Al_2O_3$, 201 mg poly(vinyl alcohol), 22 mg poly(acrylic acid) and 10.05 g water. An SEM photograph of the starting material (FIG. 5) shows the individual grains of $Al_2O_3$, tending to aggregate into chains. Initially, the water and polymers were admixed and placed in a 74° C. oven for one hour; the $Al_2O_3$ was then added and the solution was stirred. The mixture was returned to the oven for 40 minutes, stirred again, and then placed in a 100° C. oven for one hour. As some of the water had evaporated, a paste formed. The paste was pressed into a PMMA mold fabricated using LIGA technology, having a groove pattern with groove width of 40 microns and depth of 500 microns. 5000 lbs/in² pressure was applied using a Carver hydraulic laboratory press. To eliminate the remaining water from the polymer composition, the mold was heated to 100° C. for thirty minutes, and then, to pyrolyze the PMMA mold and the polymer binder, the sample was heated to 500° C. for forty-five minutes. Subsequently, to sinter the microstructure, the mold was heated to 1130° C. for 6 hours. The resulting ceramic microstructures were approximately 400 microns in height, and 35 microns wide; FIG. 6 is an optical micrograph of the grid pattern of the microstructures formed (the scale bar on the figure is 100 microns). The microstructures were removed mechanically by shearing off of the substrate surface, and a TEM photograph of the fractured product shows the nanometer size ceramic grains (FIG. 7).

EXAMPLE 2

This example describes preparation of magnetic ceramic microstructures using an epoxy resin as a binder polymer.

Figure 8:
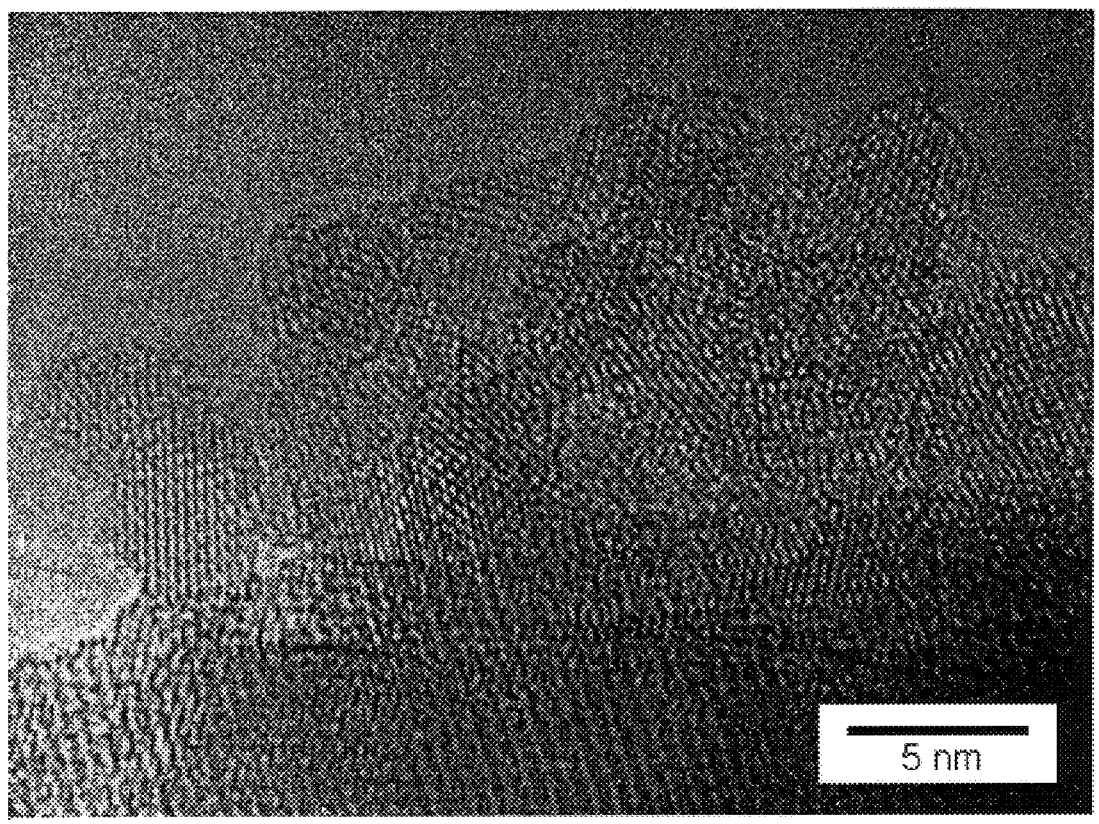
FIG. 8 is an SEM photograph of the starting material used in Example 2, and shows nanometer size (<5 mm) grains of $MnFe_2O_4$.
Figure 9:
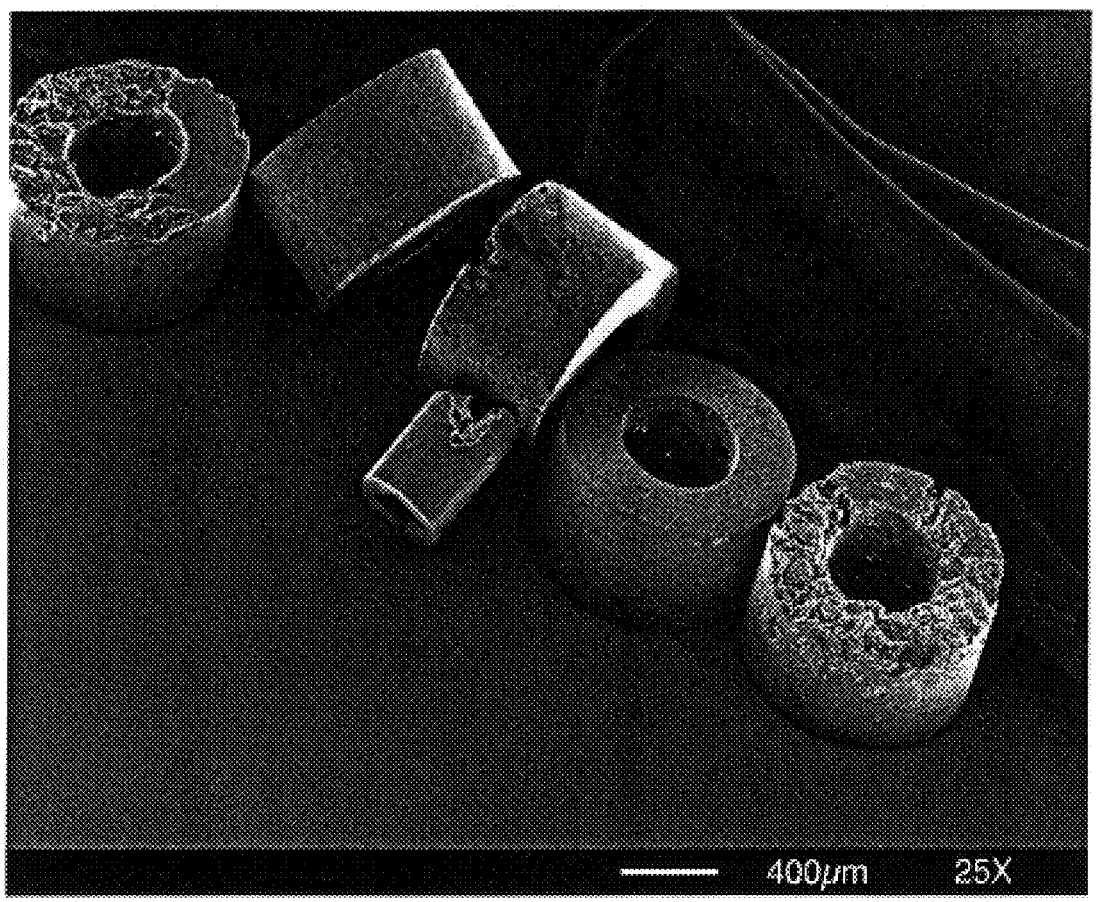
FIGS. 9, 10, 11 and 12 are SEM photographs of the ceramic microparts prepared in Example 2, magnified 25×, 75×, 100× and 200×, respectively.
Figure 10:
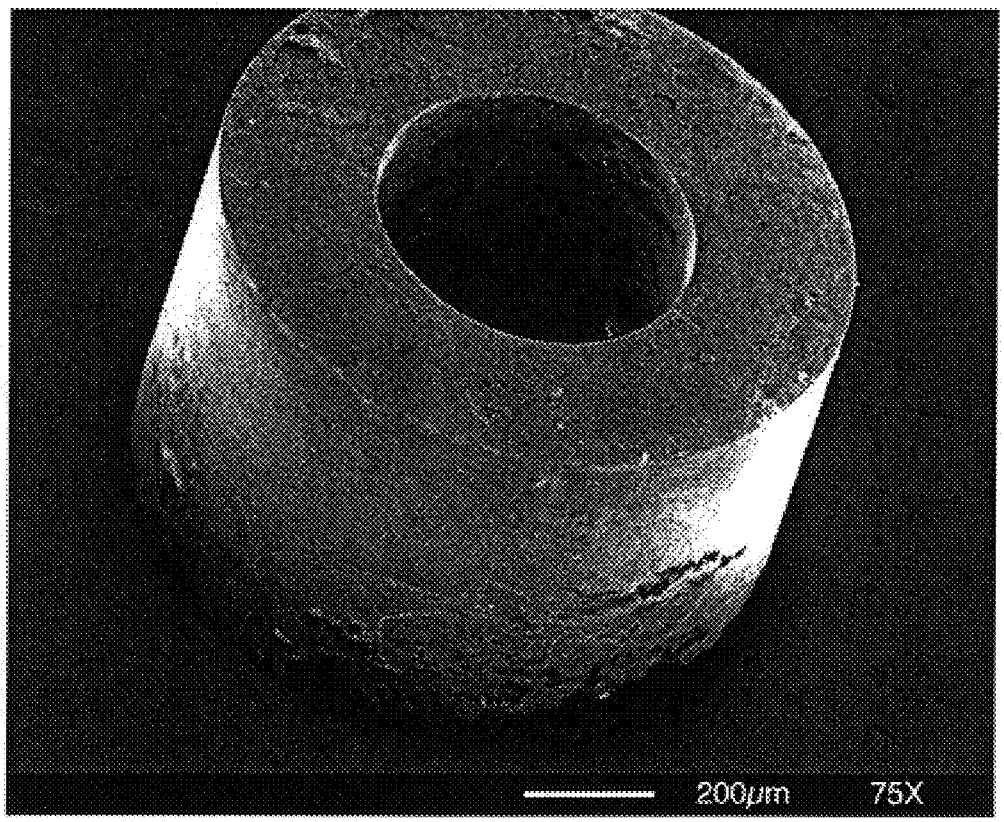
Figure 11:
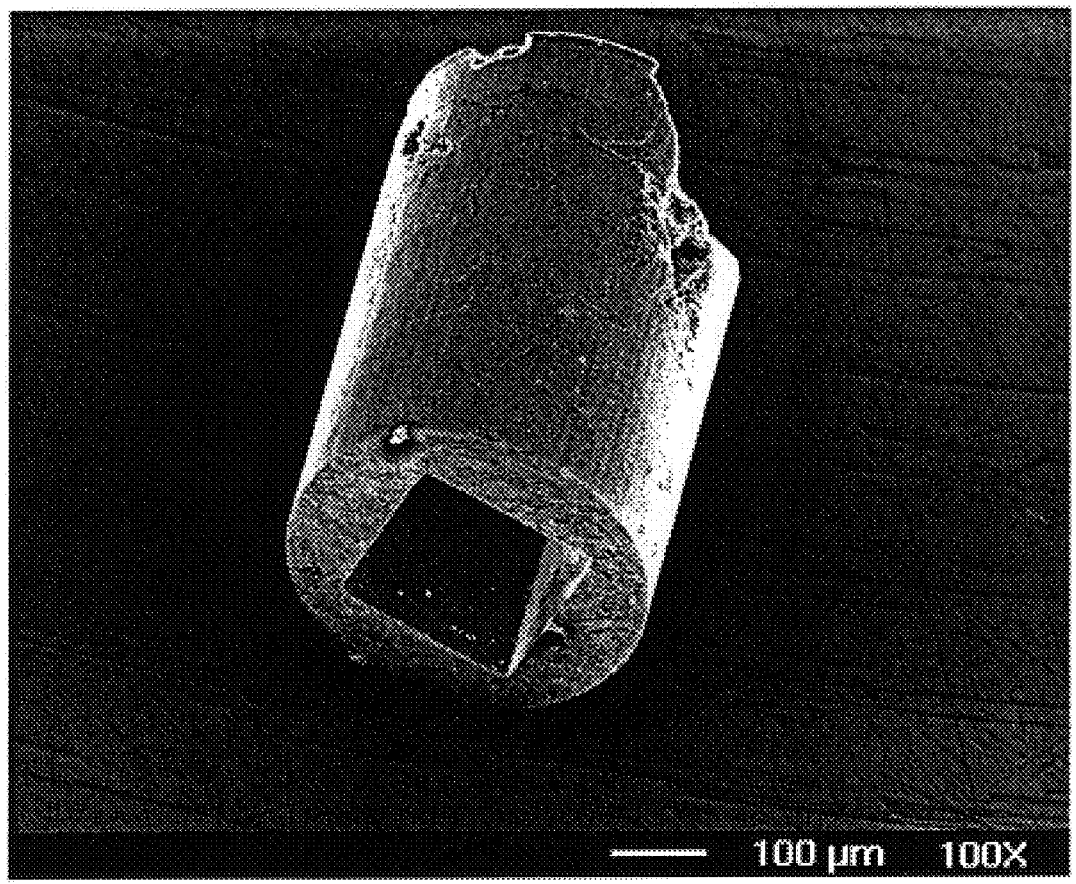
Figure 12:
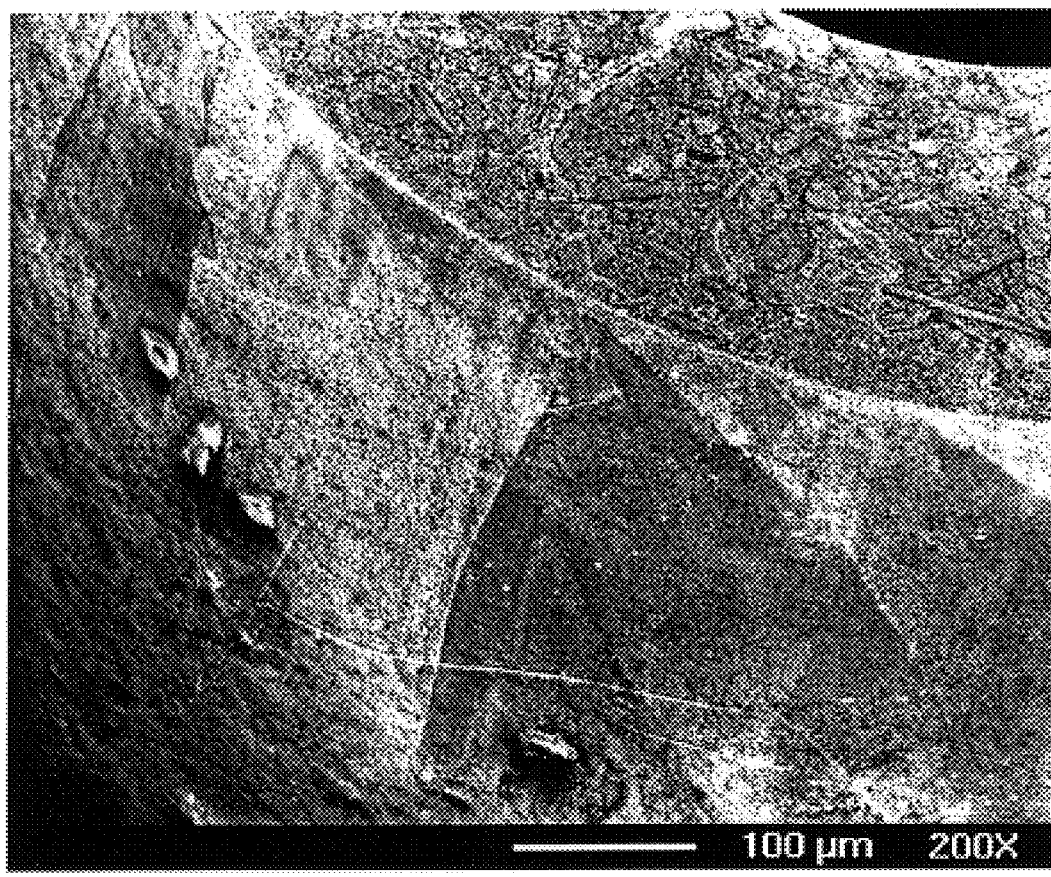
Figure 13:
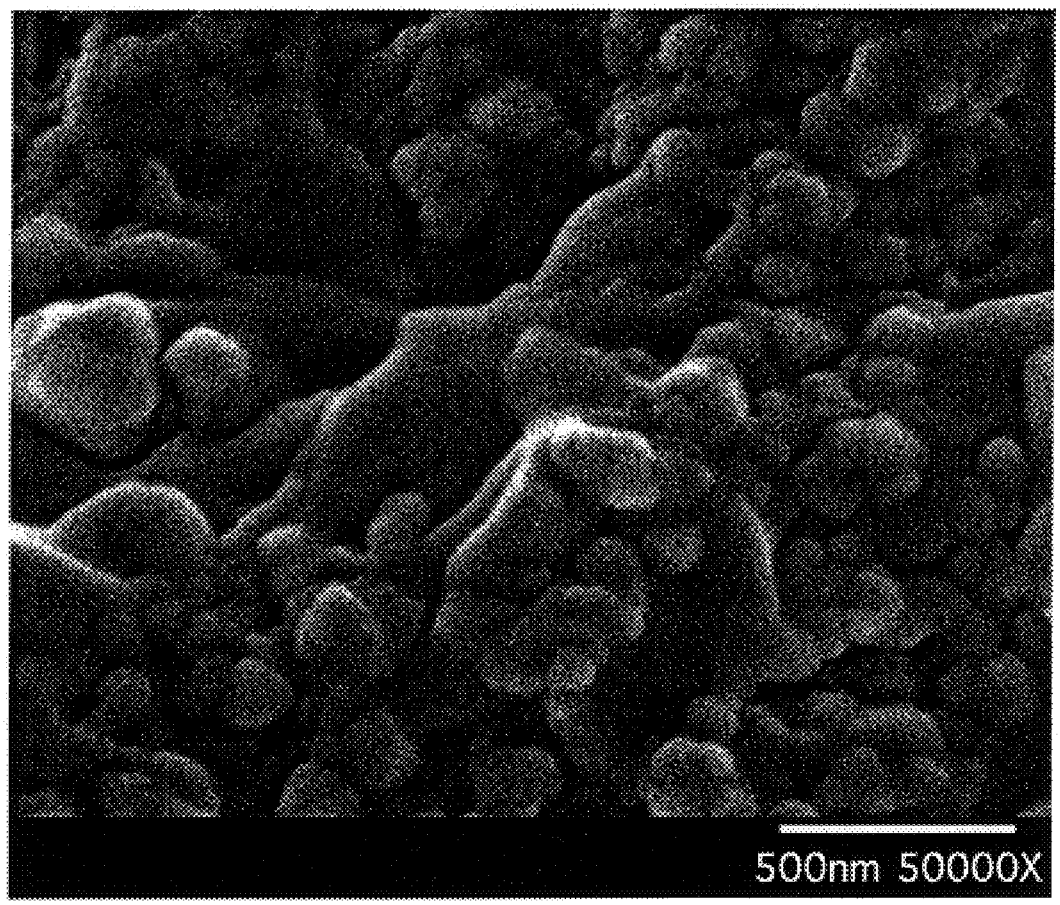
FIG. 13 is a high resolution (50,000×) SEM photograph of the product prepared in Example 2.

A paste of $MnFe_2O_4$ nanoparticles was prepared with 2.99 g $MnFe_2O_4$ and 1.53 g epoxy formulation (prepared by mixing 50 g Epon 862 epoxy resin, 5 g "736" flexibilizer, and 16 g D230 curing agent). FIG. 8 is an SEM photograph of the starting material, and individual grains of $MnFe_2O_4$, 5 nm or less in diameter, can be seen. The paste was pressed into a cylindrical PMMA mold on a metallized silicon substrate, and 9000 lbs/in² pressure was applied using a Carver hydraulic laboratory press. The mold was heated to 140° F. for five hours, allowed to cool, and immersed in acetone to dissolve the PMMA. The ceramic microparts so prepared were then sheared off of the substrate surface. FIGS. 9, 10, 11 and 12 are SEM photographs of the microparts, magnified 25×, 75×, 100× and 200×, respectively, and illustrate the sharp edges of the product. FIG. 13 is a high resolution (50,000×) SEM photograph of the product illustrating the nanometer size $MnFe_2O_4$ grains therein.

What is claimed is:

1. A method for preparing ceramic microstructures, comprising:
   (a) providing, as a mold, a substrate having a pattern on its surface, said pattern comprised of chemically removable elevated segments and corresponding voids therebetween;
   (b) applying a curable polymer composition to the substrate surface and pressing the composition into the voids of the surface pattern, said curable polymer composition comprising ceramic nanoparticles and a curable binder polymer; and
   (c) curing the polymer to provide ceramic microstructures in said voids.

2. The method of claim 1, wherein the curable binder polymer is selected from the group consisting of vinyl polymers, acrylic polymers, silicon-containing polymers, epoxy resins, and copolymers and blends thereof.

3. The method of claim 1, wherein the polymer is a thermally curable polymer and step (c) is conducted by heating the composition to a temperature sufficient to cure the polymer.

4. The method of claim 1, wherein the polymer is a chemically curable polymer, and the curable polymer composition additionally includes a curing agent.

5. The method of claim 4, wherein the chemically curable polymer is an epoxy resin.

6. The method of claim 1, wherein the polymer is a photolytically curable polymer, and step (c) is conducted by irradiating the polymer composition.

7. The method of claim 1, wherein step (c) is conducted by irradiating the polymer composition with an electron beam.

8. The method of claim 1, further including, prior to step (b), treating the substrate surface to facilitate removal of a material deposited thereon.

9. The method of claim 8, wherein the surface treatment comprises polishing.

10. The method of claim 8, wherein the surface treatment comprises deposition of a low adhesion coating comprised of a material-releasing agent.

11. The method of claim 10, wherein the material-releasing agent is selected from the group consisting of poly(tetrafluoroethylene), silicones and waxes.

12. The method of claim 11, wherein the material-releasing agent is poly(tetrafluoroethylene).

13. The method of claim 8, wherein the surface treatment comprises deposition of a chemically removable release layer.

14. The method of claim 13, wherein the release layer is comprised of poly(methyl methacrylate).

15. The method of claim 1, further including:
   (d) removing the elevated segments to provide said ceramic microstructures on the substrate surface.

16. The method of claim 15, further including:
   (e) removing the ceramic microstructures from the substrate surface.

17. The method of claim 15, further comprising pyrolyzing the ceramic microstructures by heating to a temperature effective to remove organic material contained therein and to convert any inorganic material present to ceramic material.

18. The method of claim 16, further comprising pyrolyzing the ceramic microstructures by heating to a temperature effective to remove organic material contained therein and to convert any inorganic material present to ceramic material.

19. The method of claim 17, wherein pyrolyzing is conducted at a temperature in the range of about 300° to 700°.

20. The method of claim 19, wherein pyrolyzing is conducted at a temperature in the range of about 400° C. to 600° C.

21. The method of claim 18, wherein pyrolyzing is conducted at a temperature in the range of about 300° C. to 700° C.

22. The method of claim 21, wherein pyrolyzing is conducted at a temperature in the range of about 400° C. to 600° C.

23. The method of claim 1, wherein the ceramic nanoparticles are in the range of approximately 1 to 1000 nanometers in diameter.

24. The method of claim 23, wherein the ceramic nanoparticles are in the range of approximately 1 to 500 nanometers in diameter.

25. The method of claim 24, wherein the ceramic nanoparticles are in the range of approximately 1 to 100 nanometers in diameter.

26. The method of claim 1, wherein the ceramic nanoparticles are comprised of a metal oxide.

27. The method of claim 26, wherein the metal oxide is selected from the group consisting of $Al_2O_3$, $ZrO_2$, $TiO_2$, $ZnO$, $SiO_2$, $BaTiO_3$, $SrTiO_3$, $WO_2$, $WO_3$, $Fe_2O_3$, $Fe_3O_4$, $Ca_5(PO_4)OH$, $MnFe_2O_4$, $PbZr0.5Ti_{0.5}O_3$, $BaFe_{12}O_{19}$, $CrO_2$, $Cr_2O_3$, $MoO_2$ and $MoO_3$.

28. The method of claim 1, wherein the ceramic nanoparticles are comprised of $SiC$, $Si_3N_4$ or $Si_2ON_2$.

29. The method of claim 1, wherein the ceramic nanoparticles are comprised of aluminum nitride, tungsten carbide, barium samarium cobalt, neodymium iron boride, TiN, TiC, $MoSe_2$, $MoSe_3$, $MoS_2$ or $MoS_3$.

30. The method of claim 1, wherein the mold used in part (a) is a lithographically patterned mold and the voids of the surface pattern are less than about 100 microns in diameter, so that the resulting ceramic microstructures are less than about 100 microns in diameter.

31. The method of claim 30, wherein the mold is a LIGA mold.

32. The method of claim 30, wherein the aspect ratio of the ceramic microstructure is greater than about 20:1.

33. The method of claim 32, wherein the aspect ratio of the ceramic microstructure is greater than about 40:1.

34. The method of claim 1, wherein the curable polymer composition further comprises a solvent for the curable binder polymer.

35. The method of claim 34, wherein the solvent is water or a lower alkanol.

36. The method of claim 34, wherein the ceramic nanoparticles represent approximately 5 wt. % to 95 wt. % of the curable polymer composition.

37. The method of claim 36, wherein the curable polymer represents approximately 5 wt. % to 30 wt. % of the curable polymer composition.

38. The method of claim 1, wherein the elevated segments are comprised of a photoresist material.

39. The method of claim 38, wherein the photoresist material is poly(methyl methacrylate).

40. The method of claim 1, wherein the substrate is comprised of metallized silicon.

41. The method of claim 1, further comprising, following step (b) and prior to step (c), planarizing the substrate surface to remove excess polymer composition.

42. A method for preparing ceramic microstructures, comprising:
   (a) providing a lithographically patterned mold comprising a substrate having a pattern on its surface, said pattern comprised of chemically removable elevated segments and corresponding voids therebetween, said voids having a diameter of less than about 100 microns in diameter;
   (b) applying a curable polymer composition to the substrate surface and pressing the composition into the voids of the surface pattern, said curable polymer composition comprising a paste of ceramic nanoparticles having a diameter in the range of approximately 1 nm to 1000 nm, a curable binder polymer selected from the group consisting of vinyl polymers, acrylic polymers, silicon-containing polymers, epoxy resins, and copolymers and blends thereof, and a solvent for the curable binder polymer, wherein the ceramic nanoparticles represent approximately 15 wt. % to 95 wt. % of the composition and the curable polymer represents approximately 5 wt. % to 30 wt. % of the composition;
   (c) curing the polymer to provide ceramic microstructures in said voids; and
   (d) removing the elevated segments to provide said ceramic microstructures on the substrate surface.

43. A method for preparing ceramic microstructures permanently affixed to a substrate, comprising:
   (a) providing a substrate having a substantially planar surface and a recess therein extending from the substrate surface into the substrate interior, wherein the recess is shaped such that the width of the recess at the substrate surface is smaller than the width of the recess in the substrate interior;
   (b) applying a curable polymer composition to the substrate surface and pressing the composition into the recess, said polymer composition comprising a curable binder polymer, ceramic nanoparticles and a solvent for the binder polymer, while allowing a portion of the composition to remain on the substrate surface above the recess; and
   (c) curing the binder polymer to provide a ceramic microstructure having a first segment in said recess and conforming in shape thereto, and a second segment above the substrate surface.

44. The method of claim 43, wherein the portion of the composition allowed to remain on the substrate surface in step (b) has a shape defined by chemically removable elevated segments on the substrate.

45. A method for preparing ceramic microstructures, comprising:
   (a) providing, as a mold, a substrate having a pattern on its surface, said pattern comprised of chemically removable elevated segments and corresponding voids therebetween;
   (b) forming a paste of a binder polymer, ceramic nanoparticles, and a solvent for said polymer;
   (c) applying the paste to the substrate surface and pressing the paste into the voids of the surface pattern; and
   (c) removing the solvent to provide ceramic microstructures in said voids.

46. A ceramic microstructure comprising a compressed solid of:
   a matrix of a cured polymer; and ceramic nanoparticles dispersed throughout the matrix, wherein the aspect ratio of the microstructure is greater than about 20:1.

47. The ceramic microstructure of claim 46, wherein the aspect ratio of the microstructure is greater than about 40:1.

48. The ceramic microstructure of claim 46, wherein the ceramic nanoparticles are comprised of a metal oxide.

49. The ceramic microstructure of claim 48, wherein the metal oxide is selected from the group consisting of metal oxide is selected from the group consisting of $Al_2O_3$, $ZrO_2$, $TiO_2$, $ZnO$, $SiO_2$, $BaTiO_3$, $SrTiO_3$, $WO_2$, $WO_3$, $Fe_2O_3$, $Fe_3O_4$, $Ca_5(PO_4)OH$, $MnFe_2O_4$, $PbZr_{0.5}Ti_{0.5}O_3$, $BaFe_{12}O_{19}$, $CrO_2$, $Cr_2O_3$, $MoO_2$ and $MoO_3$.

50. The ceramic microstructure of claim 46, wherein the ceramic nanoparticles are comprised of $SiC$, $Si_3N_4$ or $Si_2ON_2$.

51. The ceramic microstructure of claim 46, wherein the ceramic nanoparticles are comprised of aluminum nitride, tungsten carbide, barium samarium cobalt, neodymium iron boride, TiC, TiN, $MoSe_2$, $MoSe_3$, $MoS_2$ or $MoS_3$.

52. A ceramic microstructure prepared by the process of claim 17.

53. A ceramic microstructure prepared by the process of claim 18.

* * * * *

UNITED STATES PATENT AND TRADEMARK OFFICE
CERTIFICATE OF CORRECTION

PATENT NO. : 6,245,849 B1 Page 1 of 1
DATED : June 12, 2001
INVENTOR(S) : Alfredo Martin Morales, Z. John Zhang and Douglas Chinn It is certified that error appears in the above-identified patent and that said Letters Patent is hereby corrected as shown below:

<u>Column 1,</u>
Line 6, please insert the following new section
-- <u>ACKNOWLEDGEMENT OF GOVERNMENT SUPPORT</u>
The United States Government has rights in this invention pursuant to Contract No. DEAC04-94AL85000 between the United States Department of Energy and Sandia Corporation for the operation of Sandia National Laboratories. --

Signed and Sealed this

Ninth Day of July, 2002

Attest:

Attesting Officer

JAMES E. ROGAN
Director of the United States Patent and Trademark Office